United States Patent [19]

Shaw et al.

[11] 4,317,053
[45] Feb. 23, 1982

[54] HIGH SPEED SYNCHRONIZATION CIRCUIT

[75] Inventors: Pern Shaw, Austin; Stanley E. Groves, Round Rock, both of Tex.

[73] Assignee: Motorola, Inc., Schaumburg, Ill.

[21] Appl. No.: 100,785

[22] Filed: Dec. 5, 1979

[51] Int. Cl.³ .................. H03K 19/08; H03K 1/17
[52] U.S. Cl. .................. 307/269; 307/452; 307/480; 328/72
[58] Field of Search .......... 307/269, 208, 452, 453, 307/521, 480; 328/72, 129, 120

[56] References Cited

U.S. PATENT DOCUMENTS

| | | | |
|---|---|---|---|
| 3,942,037 | 3/1976 | Mensch, Jr. | 307/269 |
| 3,953,744 | 4/1976 | Kawagoe | 307/269 |
| 3,997,800 | 12/1976 | Bain | 307/269 |
| 4,011,465 | 3/1977 | Alvarez, Jr. | 307/208 |

Primary Examiner—Stanley D. Miller, Jr.
Assistant Examiner—B. P. Davis
Attorney, Agent, or Firm—Anthony J. Sarli, Jr.; Jeffrey Van Myers; Robert L. King

[57] ABSTRACT

In a high speed synchronizing circuit, the rising edge of an asynchronous input signal is used to set an input RS flip-flop. First and second latch registers monitor the input RS flip-flop. Each latch register generates a reset signal before a change in the logic level of the system clock for resetting the input RS flip-flop. The reset pulses are very narrow which enables the RS flip-flop to be quickly conditioned to receive the next asynchronous signal.

10 Claims, 4 Drawing Figures

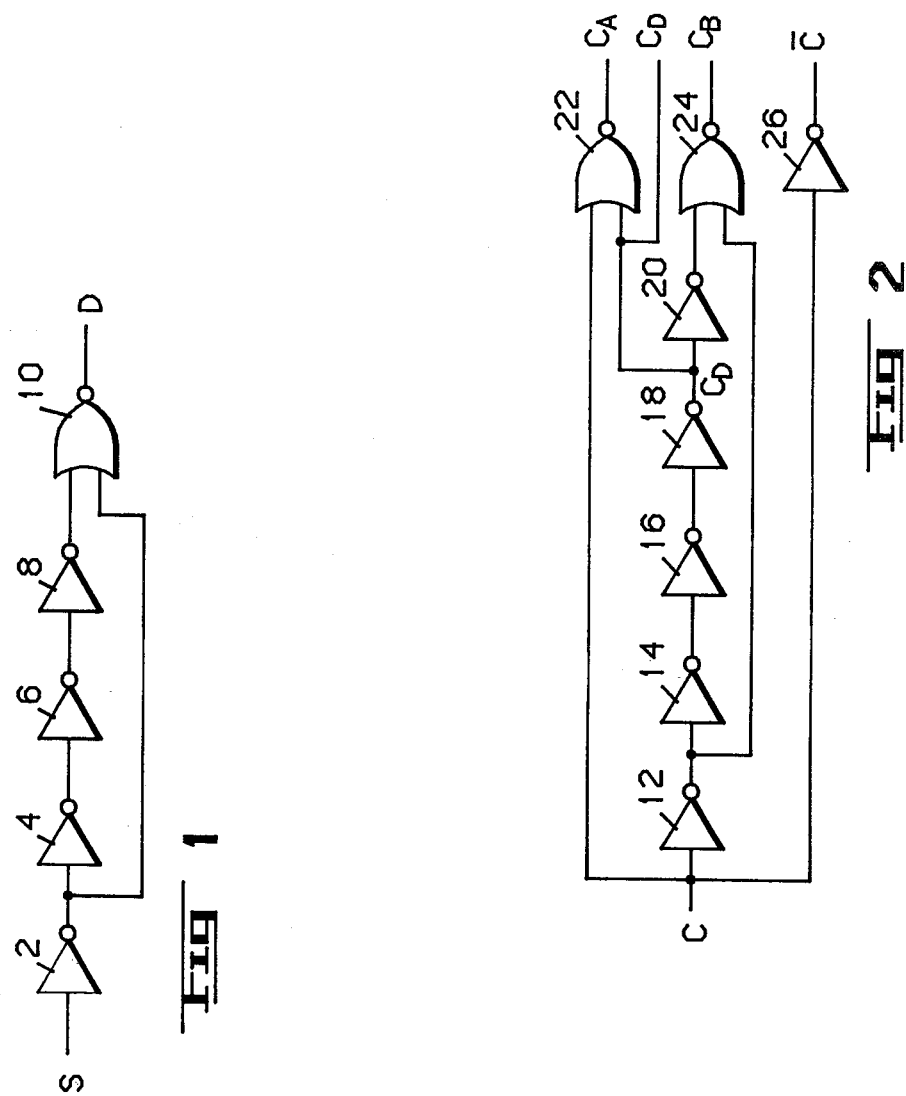

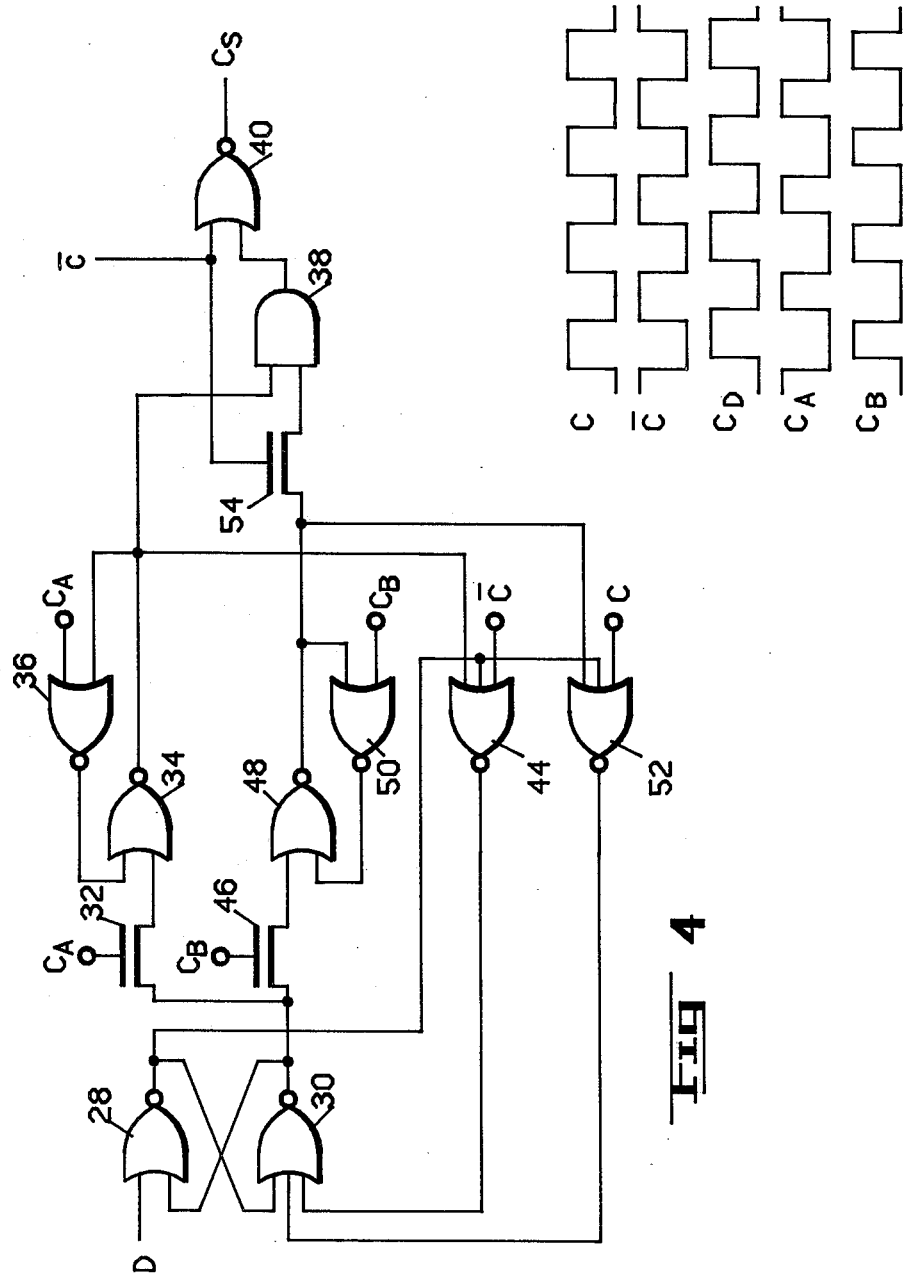

HIGH SPEED SYNCHRONIZATION CIRCUIT

BACKGROUND OF THE INVENTION

1. Field of the Invention

This invention relates generally to digital logic circuitry and, more particularly, to a high speed synchronization circuit for synchronizing an asynchronous input signal with a system clock.

2. Description of the Prior Art

As is well known, digital systems generally operate in a synchronous fashion. That is, operations are performed and data is transferred under the control of a system clock signal.

As is often the case, it may be necessary for one digital system to communicate with other digital systems operating on different unrelated clock signals or with external analog devices or circuits whose output signals are synchronous with no clock signal at all. In order to input these external signals into the operating circuitry of a digital system, it is first necessary to synchronize these input signals with the system's master clock signal or a derivative thereof.

Known synchronization circuits employ either delay type flip-flops or RS flip-flops which are set and reset by the system clock. This being the case, the known synchronization circuits are limited in frequency to less than half that of the system clock. Furthermore, the input asynchronous signal may be very long in duration and may appear as two or more sequential signals to the synchronization circuitry.

SUMMARY OF THE INVENTION

It is an object of the present invention to provide an improved high speed synchronization circuit.

It is a further object of the present invention to provide an improved sychronization circuit capable of receiving and synchronizing an external signal having a frequency equivalent to that of the system clock.

It is a still further object of the present invention that the improved high speed synchronization circuit be such as to require minimal duty cycle limitations on the asynchronous input signal.

It is yet another object of the present invention to provide an improved synchronization circuit employing a plurality of non-overlapping clock signals derived from the system clock.

Finally, it is an object of the present invention to provide a synchronization circuit for synchronizing an external asynchronous signal to a system clock having maximum frequency bandwidth and minimum pulse width sensitivity.

According to a broad aspect of the invention there is provided a high speed circuit for receiving an asynchronous signal and synchronizing said signal with a system clock signal, comprising: first logic means for generating a signal in response to receipt of said asynchronous signal; second means coupled to said first means for detecting that said signal first occurs during a first level of said system clock signal; third means coupled to said first means for detecting that said signal first occurs during a second level of said system clock signal; and fourth means coupled to said second and third means and to said system clock signal for generating a corresponding synchronized signal.

The above and other objects, features and advantages of the present invention will be more clearly understood from the following detailed description taken in conjunction with the accompanying drawings, in which:

BRIEF DESCRIPTION OF THE DRAWINGS

FIG. 1 is a logic diagram of an edge detecting circuit;

FIG. 2 is a logic diagram of a circuit which generates two non-overlapping clock signals from the system clock and the complement of the system clock;

FIG. 3 is a timing diagram illustrating waveforms corresponding to the system clock and the clock signals derived therefrom by the circuitry of FIG. 2; and FIG. 4 is a logic diagram of the remainder of the inventive synchronization circuit.

DESCRIPTION OF THE PREFERRED EMBODIMEMT

FIG. 1 shows an edge detecting circuit which is employed to convert the rising edge of an asynchronous input signal S to a pulse D of short duration. It comprises, for example, inverters 2, 4, 6 and 8 and a two input NOR gate 10. The asynchronous input signal is applied to the input of inverter 2. The output of inverter 2 is applied to inverter 4 and to a first input of NOR gate 10. The output of inverter 4 is in turn applied to the input of inverter 6, the output of which is applied to the input of inverter 8. The output of inverter 8 is applied to the second input of NOR gate 10. As should be apparent, the output of inverter 8 is a signal having the same polarity as that of the asynchronous input signal but delayed by an amount equivalent to four times the inverter delay. The output of inverter 2 on the other hand is a signal having a polarity opposite that of the asynchronous input signal and delayed therefrom by a single inverter delay. Thus, the output of NOR gate 10 will be a positive pulse having a duration substantially equivalent to three inverter delays.

FIG. 2 illustrates a clock generator which produces from the system clock C three other clock signals which provide timing control to the synchronization circuit. The circuit comprises a plurality of inverters 12, 14, 16, 18, 20 and 26, and two NOR gates 22 and 24. The operation of this circuit will be described in conjunction with the waveforms shown in FIG. 3 which illustrate the clock signals generated. The system clock C shown in FIGS. 3A is applied to a first input of NOR gate 22, to the input of inverter 12 and to the input of inverter 26. The output of inverter 26 corresponds to the inverted system clock ($\overline{C}$) shown in FIG. 3B. The output of inverter 12 is applied to a first input of NOR gate 24 and to the input of inverter 14. The output of inverter 14 is applied to the input of inverter 16, the output of which is applied to the input of inverter 18. The output of inverter 18 $C_D$ (FIG. 3C) is applied to the second input of NOR gate 22 and to the input of inverter 20, the output of which is applied to the second input of NOR gate 24. Clock signal $C_A$ appears at the output of NOR gate 22 and, as shown in FIG. 3D, is low when either the system clock C or the delayed system clock $C_D$ is high. Clock signal $C_B$ (FIG. 3E) appears at the output of NOR gate 24. As can be seen, clock pulses $C_A$ and $C_B$ are not overlapping.

FIG 4 illustrates the remainder of the inventive high speed synchronization circuit. The circuit includes an RS flip-flop comprising NOR gates 28 and 30, two latch registers the first including NOR gates 34 and 36 and the second including NOR gates 48 and 50, and three sense couplers 32, 46 and 54 each comprised of a field effect transistor. NOR gates 44 and 52 serve to reset the RS flip-flop under conditions to be described below.

The circuit operates as follows. When a pulse D, generated from the rising edge of the asynchronous input signal as described above, is applied to NOR gate 28, a logical "0" will appear at its output. Since the outputs of reset NOR gates 44 and 52 are low, a logical "1" will appear at the output of NOR gate 30. If clock $C_A$ is high, the logical "1" apparing at the output of NOR gate 30 will be transmitted to a first input of NOR gate 34. Thus, a logical "0" will appear at the output of NOR gate 34. Since this output is applied to a first input of AND gate 38, a logical "0" will appear at a first input of NOR gate 40. The second input of NOR gate 40 is a logical "0" when the system clock C is in a logical "1" state. During this condition, a logical "1" will appear at the output of NOR gate 40 ($C_S$). This output has a pulse width equal to that of the system clock pulse and is now synchronized with the system clock signal.

The output of NOR gate 34 is also coupled to a first input of NOR gate 44. The output of NOR gate 28 is coupled to a second input of NOR gate 44 (and 52) to assure that the output of NOR gate 44 (and 52) is a narrow pulse. Thus, when clock pulse $C_A$ went high, a logical "0" was applied to a first input of NOR gate 44. When the system clock next goes high ($\overline{C}$ goes low) a logical "1" will appear at the output of NOR gate 44 and applied to an input of NOR gate 30 to reset the RS flip-flop (i.e. a logical "0" will appear at the output of NOR gate 30).

As stated previously, with a logical "1" at the output of NOR gate 30 and a $C_A$ clock pulse, a logical "1" was applied to the input of NOR gate 34 to produce a logical "0" output. This logical "0" was applied to a first input of NOR gate 36. The second input of NOR gate 36 is coupled to clock signal $C_A$ which, at this time, is a logical "1". Therefore, a logical "0" will appear at the output of NOR gate 36. When $C_A$ again goes low, a logical "1" will appear at the output of NOR gate 36. This will latch the output of NOR gate 34 at a logical "0."

If the RS flip-flop were to be set and a $C_B$ clock pulse should occur, device 46 would be energized and a logical "1" would be applied to a first input of NOR gate 48. This would produce a logical "0" at the output of NOR gate 48 and at a first input of NOR gate 50. This logical "0" is applied to a first input of NOR gate 52, and the system clock (C) is applied to a second input of NOR gate 52. Thus, when the system clock next goes low, the RS flip-flop will be reset. However, when clock pulse $C_B$ next goes low, a logical "1" will appear at the output of NOR gate 50 thus latching the output of NOR gate 48 to a logical "0". When the complementary system clock C goes high, the output of NOR gate 48 will be applied to an input of AND gate 38 via sense coupler 54. The logical "0" at the input of AND gate 38 will produce a logical "0" at its output which is applied to NOR gate 40. Thus, the output of NOR gate 40 ($C_S$) will be a logical "0." Again, this signal has a width which is substantially equal to that of the system clock and is now synchronized with the system clock.

It should be noted that only the rising edge of the asynchronous signal is used to set the input RS flip-flop. Therefore, the circuit is insensitive to the pulse width or duty cycle of the asynchronous input signal. Second, both latches (34, 36 and 48, 50) employ regenerative positive feedback with switching point shifting features which eliminate undetermined logic levels. Third, and most importantly, the reset signals to the input RS flip-flop are generated only after the latches have recognized that the flip-flop has been set. Furthermore, the reset signals are generated on the next system clock level and comprise a very narrow pulse. In this way, the RS flip-flop is ready to react to the next rising edge of the asynchronous input signal.

It is to be understood that the above description is given by way of example only. Changes in form and details may be made by one skilled in the art without departing from the scope of the invention as defined by the appended claims.

We claim:

1. A high speed circuit for receiving an asynchronous signal and synchronizing said asynchronous signal with a system clock signal, comprising:
    first logic means for generating a first signal in response to receipt of said asynchronous signal;
    second means coupled to said first means for generating a second signal when the first signal occurs during a first level of said system clock signal;
    third means coupled to said first means for generating a third signal when the first signal occurs during a second level of said system clock signal; and
    fourth means coupled to said second and third means and to said system clock signal for generating a synchronized signal in response to the absence of either the second or third signals during said second level of said system clock signal.

2. A circuit according to claim 1 further comprising:
    fifth means coupled to said second means and to said first means for resetting said first means in response to the absence of both said second signal and the complement of said first signal during the second level of said system clock signal; and
    sixth means coupled to said third means and to said first means for resetting said first means in response to the absence of both said third signal and the complement of said first signal during the second level of said system clock signal.

3. A circuit according to claim 2 further including an edge detecting circuit for converting each rising edge of said asynchronous signal to a single pulse for application to said first logic means.

4. A circuit according to claim 3 wherein said first logic means comprises a set/reset flip-flop having a set input coupled to the output of said edge detector and having first and second reset inputs, said first reset input coupled to the output of said second means and said second reset input coupled to the output of said third means.

5. A high speed circuit according to claim 4 further including means for generating first, second and third clock pulse signals from said system clock, said first clock signal being the complement of said system clock signal, said second clock signal comprising a series of pulses each occurring within a low level of said system clock signal and said third clock signal comprising a plurality of pulses each occurring during a high level of said system clock signal.

6. A high speed circuit according to claim 5 wherein said second means comprises:
    a first sense coupler having an input coupled to said set/reset flip-flop, a gate coupled to said second clock pulse signal and an output;
    a first NOR gate having first and second inputs and an output, said first input coupled to said output of said first sense coupler, the output of said first NOR gate being coupled to said fourth means and to said fifth means; and a second NOR gate having first and second inputs and an output, said first input coupled to the output of said first NOR gate, said second input coupled to said second clock signal and said output coupled to the second input of said first NOR gate.

7. A high speed circuit according to claim 6 wherein said third means comprises:

a second sense coupler having an input coupled to said set/reset flip-flop, a control gate coupled to said third clock pulse signal and an output;

a third NOR gate having a first input coupled to the output of said second sense coupler and having an output coupled to said fourth means and to said sixth means; and a fourth NOR gate having first and second inputs and an output, said first input coupled to the output of said third NOR gate, said second input coupled to said third clock pulse signal and said output coupled to the second input of said third NOR gate.

8. A high speed circuit according to claim 7 wherein said fifth means comprises:

a fifth NOR gate having first, second and third inputs and an output, said first input coupled to the output of said first NOR gate, said second input coupled to said first clock signal, said third input coupled to the complementary output of said set/reset flip-flop, and said output coupled to said first reset input of the set/reset flip-flop for resetting said flip-flop.

9. A high speed circuit according to claim 8 wherein said sixth means comprises:

a sixth NOR gate having first, second and third inputs and an output, said first input coupled to the output of said third NOR gate, said second input coupled to said system clock signal, said third input coupled to the complementary output of said set/reset flip-flop and said output coupled to said second reset of the set/reset flip-flop for resetting said flip-flop.

10. A high speed circuit according to claim 9 wherein said fourth means comprises:

a third sense coupler having an input coupled to the output of said third NOR gate and having a control gate coupled to said first clock pulse signal;

a first AND gate having first and second inputs and an output, said first input coupled to the output of said first NOR gate and said second input coupled to the output of said third sense coupler; and a seventh NOR gate having first and second inputs and an output, said first input coupled to the output of said AND gate, said first input coupled to said second clock pulse signal and said synchronized signal appearing at the output of said seventh NOR gate.

* * * * *